United States Patent
Asano

(10) Patent No.: US 11,149,348 B2
(45) Date of Patent: Oct. 19, 2021

(54) METHOD FOR MANUFACTURING FUEL CELL SEPARATOR

(71) Applicant: TOYOTA JIDOSHA KABUSHIKI KAISHA, Toyota (JP)

(72) Inventor: Yuhei Asano, Miyoshi (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/674,268

(22) Filed: Nov. 5, 2019

(65) Prior Publication Data

US 2020/0149160 A1 May 14, 2020

(30) Foreign Application Priority Data

Nov. 14, 2018 (JP) .............................. JP2018-213550

(51) Int. Cl.
| | |
|---|---|
| *C23C 16/448* | (2006.01) |
| *H01M 8/0223* | (2016.01) |
| *C23C 16/40* | (2006.01) |
| *H01M 8/1226* | (2016.01) |

(52) U.S. Cl.
CPC .......... *C23C 16/448* (2013.01); *C23C 16/40* (2013.01); *H01M 8/0223* (2013.01); *H01M 8/1226* (2013.01)

(58) Field of Classification Search
CPC ... C23C 16/4486; C23C 16/407; C23C 16/00; C23C 16/40; C23C 16/448
See application file for complete search history.

(56) References Cited

U.S. PATENT DOCUMENTS

2018/0287169 A1\* 10/2018 Yagyu ................ C23C 16/4486

FOREIGN PATENT DOCUMENTS

| CN | 108690969 A | 10/2018 |
|---|---|---|
| JP | 2007-280637 A | 10/2007 |
| JP | 2017-199535 A | 11/2017 |
| JP | 2017199535 | * 4/2020 |

\* cited by examiner

*Primary Examiner* — Tabassom Tadayyon Eslami
(74) *Attorney, Agent, or Firm* — Dickinson Wright, PLLC

(57) ABSTRACT

The present disclosure provides a method for manufacturing a fuel cell separator that ensures easy manufacture of the fuel cell separator having sufficiently excellent conductive property. The method for manufacturing the fuel cell separator according to the present disclosure is a method for manufacturing a fuel cell separator where a conductive oxide film is formed on a surface of a metal substrate using a mist CVD method, and the method includes: preparing a raw material solution containing a precursor of the conductive oxide film and hydrochloric acid; atomizing the raw material solution to generate a mist; and supplying the mist to the surface of the metal substrate to form the conductive oxide film on the surface of the metal substrate through a reaction by heat.

3 Claims, 5 Drawing Sheets

METHOD FOR MANUFACTURING FUEL CELL SEPARATOR

CROSS REFERENCE TO RELATED APPLICATIONS

The present application claims priority from Japanese patent application JP 2018-213550 filed on Nov. 14, 2018, the content of which is hereby incorporated by reference into this application.

BACKGROUND

Technical Field

The present disclosure relates to a method for manufacturing a fuel cell separator where a conductive oxide film is formed on a surface of a metal substrate using a mist CVD method.

Description of Related Art

Recently, a solid polymer fuel cell device has been employed for a power source of an automobile, household cogeneration, and the like because the solid polymer fuel cell device can be operated at low temperature and reduced in size and weight. Fuel cells constituting the solid polymer fuel cell device include, for example, electrode bodies and separators. The electrode body includes a membrane electrode assembly and gas diffusion layers. The membrane electrode assembly includes an ion permeable electrolyte membrane and electrode catalyst layers that sandwich the electrolyte membrane from an anode side and a cathode side. The gas diffusion layers are disposed outside the respective electrode catalyst layers. The separators are disposed outside the gas diffusion layers. As this type of fuel cell separators, flat type separators where flow passages are separated have been known in addition to separators that include grooves for the flow passages through which a gas and a cooling medium flow. A fuel cell device has a structure where the fuel cells are stacked or a structure where the fuel cells are connected in series to obtain a desired electromotive force.

The fuel cell separator is required to have an excellent conductive property because of a function to collect electricity generated through an electrochemical reaction and a function to electrically connect the adjacent cells one another. While a metal substrate is often employed for the separator from the aspect of the strength and the like, since the metal substrate is easily corroded, the separator for which the metal substrate is employed has a problem in corrosion resistance in some cases. Therefore, when the metal substrate is employed for the separator, it has been necessary to coat the metal substrate with a conductive film having an excellent conductive property and an excellent corrosion resistance.

As this type of separator where the metal substrate is coated with the conductive film, for example, JP 2007-280637 A discloses a separator that includes a conductive resin layer electrodeposited so as to coat a metal substrate, and a metallic middle layer formed to be interposed between the metal substrate and the conductive resin layer. This separator has the improved conductive property by introducing the metallic middle layer between the metal substrate and the conductive resin layer to suppress generation of a film such as an oxide film on a surface of the metal substrate. For example, JP 2017-199535 A discloses a separator that includes a conductive oxide film formed to coat the metal substrate with the mist CVD method.

SUMMARY

However, in manufacturing the separator disclosed in JP 2007-280637 A, since a raw material cost of the middle layer is necessary in addition to that of the conductive resin layer, and a middle layer formation step needs to be introduced in addition to an electrodepositing step, a problem arises in the manufacturing cost and the manufacturing time. Accordingly, a method for easily manufacturing a separator having excellent conductive property has been required.

While the separator disclosed in JP 2017-199535 A is easily manufactured because the conductive oxide film coating the metal substrate can be easily formed with the mist CVD method, the conductive property is not sufficiently excellent.

The present disclosure has been made in view of the above-described problems, and the present disclosure provides a method for manufacturing a fuel cell separator that ensures easy manufacture of the fuel cell separator having sufficiently excellent conductive property.

To solve the above-described problems, the method for manufacturing the fuel cell separator according to the present disclosure is a method for manufacturing a fuel cell separator by forming a conductive oxide film on a surface of a metal substrate using a mist CVD method. The method for manufacturing a fuel cell separator includes: preparing a raw material solution containing a precursor of the conductive oxide film and hydrochloric acid; atomizing the raw material solution to generate a mist; and supplying the mist to the surface of the metal substrate to form the conductive oxide film on the surface of the metal substrate through a reaction by heat.

EFFECT

The present disclosure ensures the easy manufacture of the fuel cell separator having the sufficiently excellent conductive property.

DETAILED DESCRIPTION OF THE EMBODIMENTS

The following describes the embodiments of a method for manufacturing a fuel cell separator according to the present disclosure.

The method for manufacturing the fuel cell separator according to the embodiment is a method for manufacturing a fuel cell separator by forming a conductive oxide film on a surface of a metal substrate using a mist CVD method, and comprises: preparing a raw material solution containing a precursor of the conductive oxide film and hydrochloric acid; atomizing the raw material solution to generate a mist; and supplying the mist to the surface of the metal substrate to form the conductive oxide film on the surface of the metal substrate through a reaction by heat.

Here, the "mist CVD method" means a method for forming a conductive oxide film on the surface of the substrate. In this method, a raw material solution where a raw material contains a precursor of the conductive oxide film and is mixed with a solvent, such as water, an alcohol, or the like; the raw material solution is atomized to generate a mist as an agglomerate of fine droplets using, for example, a method where an ultrasonic sound wave is applied; the mist is supplied to a surface of a substrate using, for example, a method to convey the mist with a carrier gas; and the mist is reacted by heat.

Figure 1:
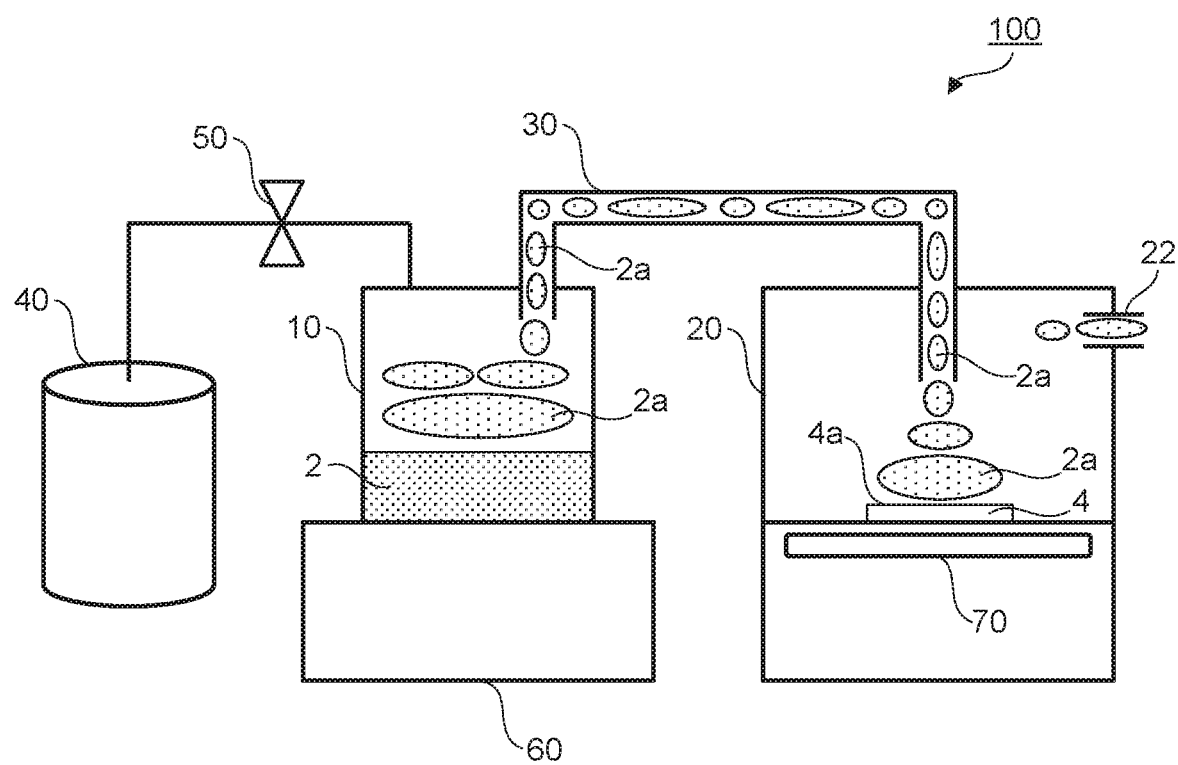
FIG. 1 is a schematic diagram of a mist CVD film formation device used in an exemplary method for manufacturing a fuel cell separator according to an embodiment of the present disclosure.
Figure 2A:
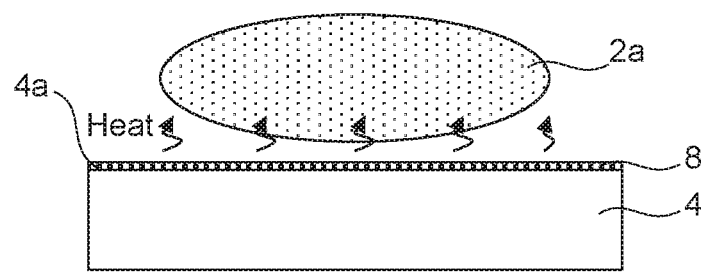
FIGS. 2A and 2B are drawings schematically illustrating a film formation reaction in the exemplary method for manufacturing the fuel cell separator according to the embodiment of the present disclosure.
Figure 2B:
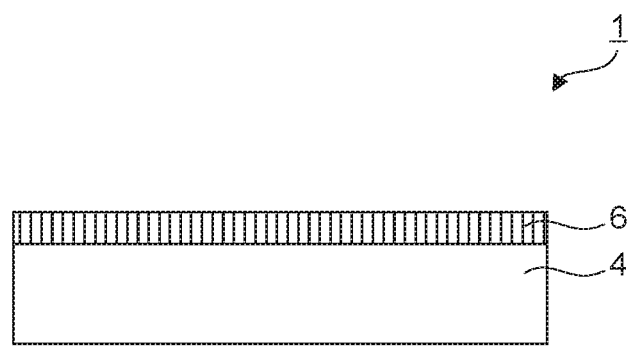

First, an exemplary method for manufacturing the fuel cell separator according to the embodiment will be described with illustration. FIG. 1 is a schematic diagram of the mist CVD film formation device used in the exemplary method for manufacturing the fuel cell separator according to the embodiment. FIGS. 2A and 2B are drawings schematically illustrating the film formation reaction in the exemplary method for manufacturing the fuel cell separator according to the embodiment.

A mist CVD film formation device 100 used in the manufacturing method in this example includes, as illustrated in FIG. 1, a solution vessel 10, a reaction vessel 20 provided with an exhaust outlet 22, a pipe passage 30 that connects the solution vessel 10 to the reaction vessel 20, a carrier gas supply source 40, a flow rate adjusting valve 50 that adjusts a flow rate of a carrier gas supplied from the carrier gas supply source 40 to the solution vessel 10, an ultrasonic wave application device 60 that applies an ultrasonic sound wave inside the solution vessel 10, and a heater 70 that heats the inside of the reaction vessel 20.

In the manufacturing method in this example, first, a raw material solution 2 where the precursor of the conductive oxide film is mixed with a water solution containing hydrochloric acid is prepared and put in the solution vessel 10 of the mist CVD film formation device 100.

Next, an ultrasonic transducer (not illustrated) included in the ultrasonic wave application device 60 is vibrated at 2.4 MHz to apply its vibration to the raw material solution 2 in the solution vessel 10, and thus the raw material solution 2 is atomized to generate a mist 2a.

Next, in a state where a metal substrate 4 disposed in the reaction vessel 20 is heated by the heater 70, the flow rate adjusting valve 50 is controlled to adjust the flow rate of the carrier gas (not illustrated) supplied from the carrier gas supply source 40 to the inside of the solution vessel 10. With this adjustment, the mist 2a generated inside the solution vessel 10 is conveyed to a surface 4a of the heated metal substrate 4 in the reaction vessel 20 by the carrier gas via the pipe passage 30. Thus, with the mist 2a reacted by heat as illustrated in FIG. 2A, a conductive oxide film 6 is formed on the surface 4a of the metal substrate 4 as illustrated in FIG. 2B. A fuel cell separator 1 is manufactured through this process.

With the manufacturing method in this example, since the mist 2a contains hydrochloric acid, as illustrated in FIG. 2A and FIG. 2B, conveying the mist 2a to the heated surface 4a of the metal substrate 4 ensures removing a film 8 such as an oxide film generated on the surface 4a of the metal substrate 4 by the action of hydrochloric acid at the same time of forming the conductive oxide film 6 on the surface 4a of the metal substrate 4.

Accordingly, with the embodiment, as the above-described example, since the conductive oxide film is formed on the surface of the metal substrate using the mist CVD method to supply the mist generated by atomizing the raw material solution containing hydrochloric acid to the surface of the metal substrate, the film such as an oxide film generated on the surface of the metal substrate can be removed by the action of hydrochloric acid contained in the mist simultaneously with the formation of the conductive oxide film. Therefore, the fuel cell separator having the sufficiently excellent conductive property can be easily manufactured.

Next, the method for manufacturing the fuel cell separator according to the embodiments will be described in detail mainly about conditions of respective steps.

1. Preparing Step

In the preparing step, a raw material solution containing the precursor of the conductive oxide film and hydrochloric acid is prepared. That is, the raw material solution where the precursor of the conductive oxide film is mixed with a water solution containing hydrochloric acid is prepared.

The mass concentration of hydrochloric acid in the raw material solution is not specifically limited but, for example, in a range of 3.0 mass % or less. The mass concentration of hydrochloric acid in the raw material solution may be in a range of 1.7 mass % or more and 3.0 mass % or less, and may be in a range of 1.7 mass % or more and 2.0 mass % or less, or in a range of 1.7 mass % or more and 1.8 mass % or less in some embodiments. This is because the excessively low mass concentration of hydrochloric acid possibly fails to effectively remove the film such as the oxide film on the surface of the metal substrate, thus possibly failing to form the conductive oxide film having an excellent crystallinity. The excessively high mass concentration of hydrochloric acid possibly changes the crystallinity of the conductive oxide film to decrease its conductivity.

The raw material solution may further contain nitric acid. That is, the raw material solution where the precursor of the conductive oxide film is mixed with the water solution containing hydrochloric acid and nitric acid may be used. This is because the raw material solution further containing nitric acid in addition to hydrochloric acid can more effectively remove the film such as the oxide film on the surface of the metal substrate due to, for example, an aqua regia generated through the reaction of hydrochloric acid and nitric acid. In addition, the crystallinity of the conductive oxide film can be improved.

In the case where the raw material solution further contains nitric acid, a ratio of the mass concentration of nitric acid to the mass concentration of hydrochloric acid in the raw material solution is not specifically limited, but, for example, in a range of 0.4 or more and 3.6 or less, and may be in a range of 1.8 or more and 3.6 or less, or in a range of 1.8 or more and 2.8 or less in some embodiments. Specifically, for example, in the case where the mass concentration of hydrochloric acid is 1.7 mass %, the mass concentration of nitric acid is, for example, in a range of 0.7 mass % or more and 6.0 mass % or less, and may be in a range of 3.1 mass % or more and 6.0 mass % or less, or in a range of 3.1 mass % or more and 4.6 mass % or less in some embodiments. This is because the excessively low ratio of the mass concentration of nitric acid possibly fails to more effectively remove the film such as the oxide film on the surface of the metal substrate. The excessively high ratio of the mass concentration of nitric acid causes the suppressed improvement of the film removal effect, and possibly changes the crystallinity of the conductive oxide film to decrease its conductivity.

The precursor of the conductive oxide film is not specifically limited insofar as the material is capable of forming the conductive oxide film, but the precursor may contain a metallic element.

The metallic element is not specifically limited but may include at least one kind selected from the group consisting of Sn, Ti, Al, Zr, Zn, In, Ga, and the like. The metallic element may be Sn, Ti, Al, and the like, or Sn and the like in some embodiments. The metallic element is mixed with the water solution, for example, containing the hydrochloric acid in the form of a salt such as a halide, a complex, or the like. Therefore, when the metallic element is Sn, the metallic element is mixed with the water solution containing hydrochloric acid in the form of, for example, tin chloride ($SnCl_2$, $SnCl_4$).

The concentration of the metallic element in the raw material solution is not specifically limited, but may be, for example, in a range of 0.02 mol/L to 5.0 mol/L, or in a range of 0.02 mol/L to 1.0 mol/L in some embodiments. This is because the excessively low concentration of the metallic element requires too much time for a crystal growth while the excessively high concentration of the metallic element increases the amount of hydrochloric acid and the amount of nitric acid for dissolution to possibly cause the poor crystallinity.

The precursor of the conductive oxide film may further contain a dopant in addition to the metallic element. The dopant is not specifically limited but may include, for example, at least one kind selected from the group consisting of Sb, Nb, F, Bi, Se, Te, Cl, Br, I, V, P, and Ta. The dopant may be Sb and the like in some embodiments. The dopant is mixed with the water solution containing the hydrochloric acid in the form of a salt such as, for example, a halide, a complex, or the like. Therefore, when the dopant is Sb, the dopant is mixed with the water solution containing hydrochloric acid in the form of, for example, antimony chloride ($SbCl_3$, $SbCl_5$).

The concentration of the dopant in the raw material solution is not specifically limited, but may be, for example, in a range of 0.0014 mol/L to 0.35 mol/L, or in a range of 0.0014 mol/L to 0.07 mol/L in some embodiments. This is because the conductive oxide film having the excellent conductivity can be formed.

2. Atomizing Step

In the atomizing step, the raw material solution is atomized to generate the mist. Note that the mist is a collection of fine droplets.

The method for generating the mist by atomizing the raw material solution is not specifically limited but may include, for example, a method for generating the mist by atomizing the raw material solution in which the raw material solution is put into a solution vessel, subsequently, for example, an ultrasonic transducer included in the ultrasonic wave application device is vibrated at 2.4 MHz, and the vibration is applied to the raw material solution in the solution vessel, using the mist CVD film formation device as illustrated in FIG. 1.

The size of the fine droplet contained in the mist is not specifically limited, but may be a common size in the mist CVD method. The size of the fine droplet contained in the mist is, for example, in a range of a few mm or less, and may be in a range of 50 μm or less, or in a range of 1 μm to 10 μm in some embodiments. The "size of the fine droplet contained in the mist" means a 50% cumulative particle diameter in the particle diameter distribution, and is measured using, for example, a particle diameter distribution measurement device of a laser diffraction/scattering type.

3. Film Forming Step

In the film forming step, the mist is supplied to the surface of the metal substrate and reacted by heat to form the conductive oxide film on the surface of the metal substrate.

Here, the "surface of the metal substrate" means an outer surface of the metal substrate, and it may be one principal surface of the metal substrate or may be the other principal surface of the metal substrate.

(1) Metal Substrate

The material of the metal substrate is not specifically limited, and the material typically used for the fuel cell separator is usable. However, the material may be a metal such as iron, titanium, aluminum, copper, or magnesium, or an alloy such as a ferrous alloy, a titanium alloy, an aluminum alloy, a copper alloy, or a magnesium alloy, and may be the iron or the ferrous alloy such as a stainless steel or an iron-nickel alloy, or the stainless steel in some embodiments. This is because they are excellent in conductive property, strength, and workability.

The stainless steel includes, for example, an austenitic stainless steel such as SUS304 or SUS316, a ferritic stainless steel such as SUS430, or a martensitic stainless steel such as SUS420.

The shape of the metal substrate is not specifically limited insofar as it is the shape of the metal substrate typically constituting the fuel cell separator, and may be a shape where a groove for a flow passage of the separator is provided on the surface of the metal substrate or a flat plate shape without the groove for the flow passage of the separator on the surface of the metal substrate. In the case of the flat plate shape, the metal substrate constitutes, for example, a flat type separator where the flow passage is separated. The shape of the metal substrate may be the shape where the groove for the flow passage of the separator is provided on the surface of the metal substrate. This is because when the conductive oxide film is formed on the position on the surface of the metal substrate where the groove for the flow passage of the separator is provided, especially there is an advantage such as an improved gas supply performance and an improved discharge performance of the generated water.

The thickness of the metal substrate is not specifically limited and can be set depending on the material of the metal substrate in consideration of the strength, the workability, and the like. When the stainless steel is used, the thickness of the metal substrate is, for example, in a range of 0.1 mm to 1 mm.

(2) Method for Supplying Mist

The method for supplying the mist to the surface of the metal substrate is not specifically limited, and a method typically used in the mist CVD method can be used. For example, the method for supplying the mist includes a method where, with the use of the mist CVD film formation device as illustrated in FIG. 1, for example, the flow rate adjusting valve is controlled to adjust the flow rate of the carrier gas supplied from the carrier gas supply source to the inside of the solution vessel, and with this adjustment, the mist generated inside the solution vessel is conveyed to the surface of the metal substrate in the reaction vessel by the carrier gas via the pipe passage.

The kind of the carrier gas in such a method is not specifically limited, and a kind typically used in the mist CVD method can be used. The carrier gas includes oxygen, ozone, air, an inert gas such as nitrogen or argon, a reducing gas such as a hydrogen gas, or the like. As the carrier gas, one kind of gasses may be used, or a mixed gas of two or more kinds may be used.

The flow rate of the carrier gas is not specifically limited, and the flow rate typically used in the mist CVD method can be used. For example, the flow rate of the carrier gas may be in a range of 0.1 L/minute to 20 L/minute. Note that the concentration of the mist supplied to the surface of the metal substrate is adjustable depending on, for example, the flow rate of the carrier gas.

(3) Conductive Oxide Film Formation

The method for forming the conductive oxide film on the surface of the metal substrate through a reaction of the mist by heat is not specifically limited, and a method typically used in the mist CVD method can be used. For example, the method for forming the conductive oxide film on the surface of the metal substrate includes a method in which, with the use of the mist CVD film formation device as illustrated in FIG. 1, in the state where the metal substrate disposed in the reaction vessel is heated by the heater, the mist is conveyed to the heated surface of the metal substrate to be reacted by heat.

The heating temperature of the surface of the metal substrate in such a method is not specifically limited, and a temperature typically used in the mist CVD method can be used. For example, the heating temperature of the surface of the metal substrate is in a range of 120° C. to 900° C., and may be in a range of 420° C. to 480° C., or in a range of 435° C. to 465° C. in some embodiments.

The film formation time (time period for supplying the mist to the surface of the metal substrate) in such a method is not specifically limited, and a time typically used in the mist CVD method can be used. For example, the film formation time may be in a range of one minute to 20 minutes. This is because the excessively short film formation time forms an excessively thin conductive oxide film while the excessively long film formation time forms an excessively thick conductive oxide film in some cases.

The conductive oxide film is not specifically limited, and may be a conductive metal oxide film containing a metallic element. The conductive metal oxide film includes, for example, a film formed of an oxide of at least one kind of the metallic element selected from the group consisting of Sn, Ti, Al, Zr, Zn, In, Ga, and the like. The conductive metal oxide film may be a film formed of tin oxide ($SnO_x$), titanium oxide ($TiO_x$), alumina ($Al_2O_3$), or the like, or a film formed of the tin oxide and the like in some embodiments.

The conductive metal oxide film may be, for example, a film that contains at least one kind of dopant selected from the group consisting of Sb, Nb, F, Bi, Se, Te, Cl, Br, I, V, P, Ta. and the like. An antimony doped tin oxide (ATO) where tin oxide ($SnO_x$) is doped with Sb may be employed in some embodiments.

The thickness of the conductive oxide film is not specifically limited, but in a range of, for example, 10 nm to 100 μm, or may be in a range of 20 nm to 1000 nm. This is because the fuel cell separator having the sufficiently excellent conductive property can be provided and the manufacturing cost of the conductive oxide film can be reduced.

The thickness of the conductive oxide film can be adjusted by controlling the concentration of the mist supplied to the surface of the metal substrate, the film formation time, or the like.

4. Method for Manufacturing Fuel Cell Separator and Fuel Cell Separator

In the method for manufacturing the fuel cell separator, the conductive oxide film is formed on the surface of the metal substrate using the mist CVD method to manufacture the fuel cell separator that includes the metal substrate and the conductive oxide film formed on the surface of the metal substrate.

The method for manufacturing the fuel cell separator is not specifically limited, and a method where the conductive oxide film is formed on any of one principal surface or the other principal surface of the metal substrate may be employed, or a method where the conductive oxide films are formed on both principal surfaces of the metal substrate may be employed. The method where the conductive oxide films are formed on both principal surfaces of the metal substrate may be employed in some embodiments. This is because the contact resistance can be reduced on both principal surface sides of the fuel cell separator.

The contact resistance of the fuel cell separator is not specifically limited, but may be 10 mΩ·cm$^2$ or less. This is because the fuel cell separator having the sufficiently excellent conductive property can be provided.

Here, the "contact resistance of the fuel cell separator" is, for example, a value calculated based on a value of a voltage applied between the fuel cell separator and the gas diffusion layer which is measured when a current of IA is flown in a state where a gas diffusion layer (TGP-H-060 manufactured by Torav Industries, Inc.) is layered on the surface of the conductive oxide film of the fuel cell separator, and a load of 1 MPa is applied in the layered direction.

The fuel cell separator is not specifically limited, and include, for example, a separator that includes a groove for a flow passage through which the gas and a cooling medium flow and a flat type separator where the flow passage is separated. The application of the fuel cell separator is not specifically limited insofar as the operational advantage of the present disclosure is obtained, and includes a solid polymer fuel cell device and the like.

5. Manufacturing Equipment of Fuel Cell Separator

The manufacturing equipment used for the method for manufacturing the fuel cell separator is not specifically limited, and manufacturing equipment typically used in the mist CVD method can be used. The manufacturing equipment includes, for example, the mist CVD film formation device as illustrated in FIG. 1.

EXAMPLES

The following further specifically describes the method for manufacturing the fuel cell separator according to the embodiment with examples, a comparative example, and reference examples.

Example 1-1

First, the metal substrate using the stainless steel (SUS304) was prepared (preparing step). Next, the raw material solution was made (preparing step) such that a water solution (110 mL) was adjusted by mixing hydrochloric acid, nitric acid, and pure water so as to have mass concentrations of hydrochloric acid and nitric acid of 1.7 mass % and 3.1 mass %, respectively, in the raw material solution, and $SnCl_2$ and $SbCl_3$ were mixed with the water solution so as to make the raw material solution which has a Sn concentration of 0.02 mol/L and a Sb concentration of 0.0014 mol/L.

Next, a mist CVD film formation device manufactured by Toshiba Mitsubishi-Electric Industrial Systems Corporation was used to form a conductive oxide film on a surface of the metal substrate using the mist CVD method. The following specifically describes the film formation.

First, after the raw material solution was put into a solution vessel, an ultrasonic transducer was vibrated at 2.4 MHz to apply the vibration to the raw material solution in the solution vessel, and thus, the raw material solution was atomized to generate a mist (atomizing step).

Next, in a state where the metal substrate disposed in a reaction vessel was heated by a heater, a flow rate adjusting valve was controlled to adjust a flow rate of a carrier gas (not illustrated) supplied from a carrier gas supply source to inside the solution vessel, and thus, the mist generated in the solution vessel was conveyed to the surface of the heated metal substrate in the reaction vessel by the carrier gas via the pipe passage. Thus, the conductive oxide film was formed on the surface of the metal substrate through the reaction of the mist by heat (film forming step). At this time, nitrogen was used as the carrier gas, the flow rate of the carrier gas was set to 7 L/minute, a heating temperature of the surface of the metal substrate was set to 460° C., and a film formation time was set to 10 minutes.

A test specimen of the fuel cell separator was manufactured as described above. The conductive oxide film formed of antimony doped tin oxide (ATO) having the thickness of 300 nm was obtained.

Example 1-2

The conductive oxide film was formed on the surface of the metal substrate and the test specimen of the fuel cell separator was manufactured similarly to Example 1-1 except that the raw material solution was made by mixing $SnCl_2$ and $SbCl_3$ with the water solution adjusted so as to have the mass concentrations of hydrochloric acid and nitric acid of 3.0 mass % and 3.1 mass %, respectively, in the raw material solution.

COMPARATIVE EXAMPLE

The conductive oxide film was formed on the surface of the metal substrate and the test specimen of the fuel cell separator was manufactured similarly to Example 1-1 except that the raw material solution was made by mixing $SnCl_2$ and $SbCl_3$ with the water solution adjusted by mixing nitric acid and pure water without mixing hydrochloric acid so as to have the mass concentration of nitric acid of 3.1 mass % in the raw material solution.

Evaluation 1

Figure 3:
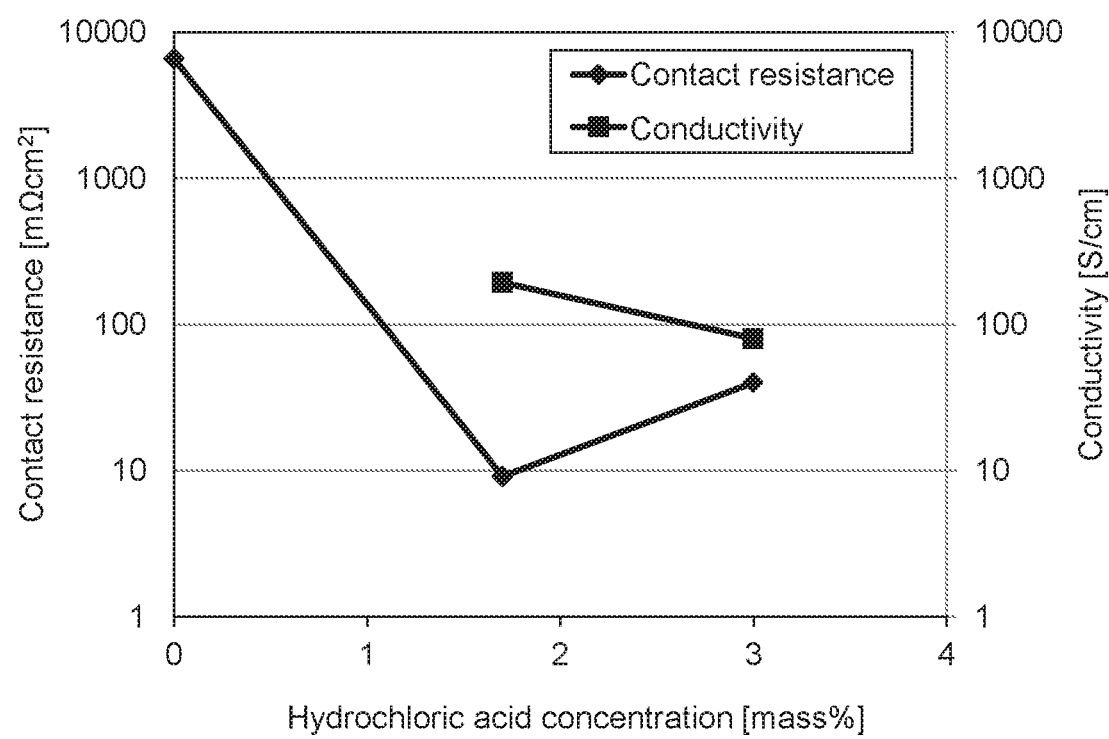
FIG. 3 is a graph indicating a contact resistance and a conductivity with respect to a mass concentration of hydrochloric acid for test specimens of Example 1-1, Example 1-2, and Comparative Example.

For the test specimens of Example 1-1, Example 1-2, and Comparative Example, the contact resistance (mΩ·cm$^2$) and the conductivity (S/cm) were obtained. The contact resistance was calculated based on a value of a voltage applied between the test specimen and the gas diffusion layer which was measured when a current of 1 A was flown in a state where a gas diffusion layer (TGP-H-060 manufactured by Toray Industries, Inc.) was layered on the surface of the conductive oxide film of the test specimen, and a load of 1 MPa was applied in the layered direction. The conductivity was calculated based on a thickness and a surface resistivity (S/square) of a conductive oxide film which was formed on a surface of a glass substrate (manufactured by Hiraoka Special Glass Mfg. Co., Ltd.) under the same conditions as the test specimens of Example 1-1, Example 1-2, and Comparative Example after the thickness of this conductive oxide film was actually measured, and a surface resistivity measuring device (manufactured by Mitsubishi Chemical Corporation) was used to measure the surface resistivity (Ω/square). Table 1 indicates the mass concentrations of hydrochloric acid, the mass concentrations of nitric acid, the contact resistances, and the conductivities of the test specimens of Example 1-1, Example 1-2, and Comparative Example with the contact resistance of a surface of an unprocessed metal substrate. FIG. 3 is a graph indicating the contact resistance and the conductivity with respect to the mass concentration of hydrochloric acid of the test specimens of Example 1-1, Example 1-2, and Comparative Example.

TABLE 1

| | Hydrochloric acid concentration [mass %] | Nitric acid concentration [mass %] | Contact resistance [mΩ·cm$^2$] | Conductivity [S/cm] |
|---|---|---|---|---|
| Example 1-1 | 1.7 | 3.1 | 9.1 | 194 |
| Example 1-2 | 3.0 | 3.1 | 40 | 80 |
| Comparative example | — | 3.1 | 6580 | — |
| Unprocessed metal substrate | — | — | 100 | — |

* For comparative example, conductivity could not be obtained because the surface resistivity was excessively high and unmeasurable.

As indicated by Table 1 and FIG. 3, in Comparative Example using the raw material solution where the mass concentration of nitric acid was 3.1 mass % and hydrochloric acid was not contained, the conductivity was excessively low and could not be measured, and the contact resistance was considerably high. The result of the excessively low conductivity is considered to be caused by the formation of the conductive oxide film having poor crystallinity and the like, and the considerably high contact resistance is considered to be caused by, for example, the lowered conductivity of the conductive oxide film and an additionally formed film having a high resistance on the surface of the metal substrate due to the action of nitric acid.

In contrast, in Examples 1-1 and 1-2 using the raw material solution where the mass concentration of nitric acid was the same as that in Comparative Example and hydrochloric acid was contained, the conductivity was significantly improved and the contact resistance was significantly decreased. The significant improvement of the conductivity is considered to be caused by the formation of the conductive oxide film having the excellent crystallinity and the like. The significant decrease of the contact resistance is considered to be caused by the effective removal of the film such as the oxide film on the surface of the metal substrate, the significant improvement of the conductivity of the conductive oxide film, and the like. When the mass concentration of hydrochloric acid became more than 1.7 mass %, the conductivity was decreased and the contact resistance was increased. This is considered to be caused by the changed crystallinity of the conductive oxide film and the like.

Example 2-1

The conductive oxide film was formed on the surface of the metal substrate and the test specimen of the fuel cell separator was manufactured similarly to Example 1-1 except that the raw material solution was made by mixing $SnCl_2$ and $SbCl_3$ with the water solution adjusted by mixing hydrochloric acid and pure water without mixing nitric acid so as to have the mass concentration of hydrochloric acid of 1.7 mass % in the raw material solution.

Example 2-2

The conductive oxide film was formed on the surface of the metal substrate and the test specimen of the fuel cell separator was manufactured similarly to Example 1-1 except that the raw material solution was made by mixing $SnCl_2$ and $SbCl_3$ with the water solution adjusted so as to have the mass concentrations of hydrochloric acid and nitric acid of 1.7 mass % and 0.7 mass %, respectively, in the raw material solution.

Example 2-3

The conductive oxide film was formed on the surface of the metal substrate and the test specimen of the fuel cell separator was manufactured similarly to Example 1-1 except that the raw material solution was made by mixing $SnCl_2$ and $SbCl_3$ with the water solution adjusted so as to have the mass concentrations of hydrochloric acid and nitric acid of 1.7 mass % and 1.3 mass %, respectively, in the raw material solution.

Example 2-4

The conductive oxide film was formed on the surface of the metal substrate and the test specimen of the fuel cell separator was manufactured similarly to Example 1-1 except that the raw material solution was made by mixing $SnCl_2$ and $SbCl_3$ with the water solution adjusted so as to have the mass concentrations of hydrochloric acid and nitric acid of 1.7 mass % and 3.1 mass %, respectively, in the raw material solution.

Example 2-5

The conductive oxide film was formed on the surface of the metal substrate and the test specimen of the fuel cell separator was manufactured similarly to Example 1-1 except that the raw material solution was made by mixing $SnCl_2$ and $SbCl_3$ with the water solution adjusted so as to have the mass concentrations of hydrochloric acid and nitric acid of 1.7 mass % and 4.6 mass %, respectively, in the raw material solution.

Example 2-6

The conductive oxide film was formed on the surface of the metal substrate and the test specimen of the fuel cell separator was manufactured similarly to Example 1-1 except that the raw material solution was made by mixing $SnCl_2$ and $SbCl_3$ with the water solution adjusted so as to have the mass concentrations of hydrochloric acid and nitric acid of 1.7 mass % and 6.0 mass %, respectively, in the raw material solution.

Reference Example 1

Each step was performed similarly to Example 2-1 except that the water solution adjusted by mixing hydrochloric acid and pure water without mixing nitric acid so as to have the mass concentration of hydrochloric acid of 1.7 mass % was directly atomized without mixing $SnCl_2$ and $SbCl_3$ to generate the mist. Thus, the test specimen without the conductive oxide film on the surface of the metal substrate was manufactured.

Reference Example 2

Each step was performed similarly to Example 2-2 except that the water solution adjusted so as to have the mass concentrations of hydrochloric acid and nitric acid of 1.7 mass % and 0.7 mass %, respectively, was directly atomized without mixing $SnCl_2$ and $SbCl_3$ to generate the mist. Thus, the test specimen without the conductive oxide film on the surface of the metal substrate was manufactured.

Reference Example 3

Each step was performed similarly to Example 2-3 except that the water solution adjusted so as to have the mass concentrations of hydrochloric acid and nitric acid of 1.7 mass % and 1.3 mass %, respectively, was directly atomized without mixing $SnCl_2$ and $SbCl_3$ to generate the mist. Thus, the test specimen without the conductive oxide film on the surface of the metal substrate was manufactured.

Reference Example 4

Each step was performed similarly to Example 2-4 except that the water solution adjusted so as to have the mass concentrations of hydrochloric acid and nitric acid of 1.7 mass % and 3.1 mass %, respectively, was directly atomized without mixing $SnCl_2$ and $SbCl_3$ to generate the mist. Thus, the test specimen without the conductive oxide film on the surface of the metal substrate was manufactured.

Reference Example 5

Each step was performed similarly to Example 2-5 except that the water solution adjusted so as to have the mass concentrations of hydrochloric acid and nitric acid of 1.7 mass % and 4.6 mass %, respectively, was directly atomized without mixing $SnCl_2$ and $SbCl_3$ to generate the mist. Thus, the test specimen without the conductive oxide film on the surface of the metal substrate was manufactured.

Reference Example 6

Each step was performed similarly to Example 2-6 except that the water solution adjusted so as to have the mass concentrations of hydrochloric acid and nitric acid of 1.7 mass % and 6.0 mass %, respectively, was directly atomized without mixing $SnCl_2$ and $SbCl_3$ to generate the mist. Thus, the test specimen without the conductive oxide film on the surface of the metal substrate was manufactured.

Evaluation 2

Figure 4:
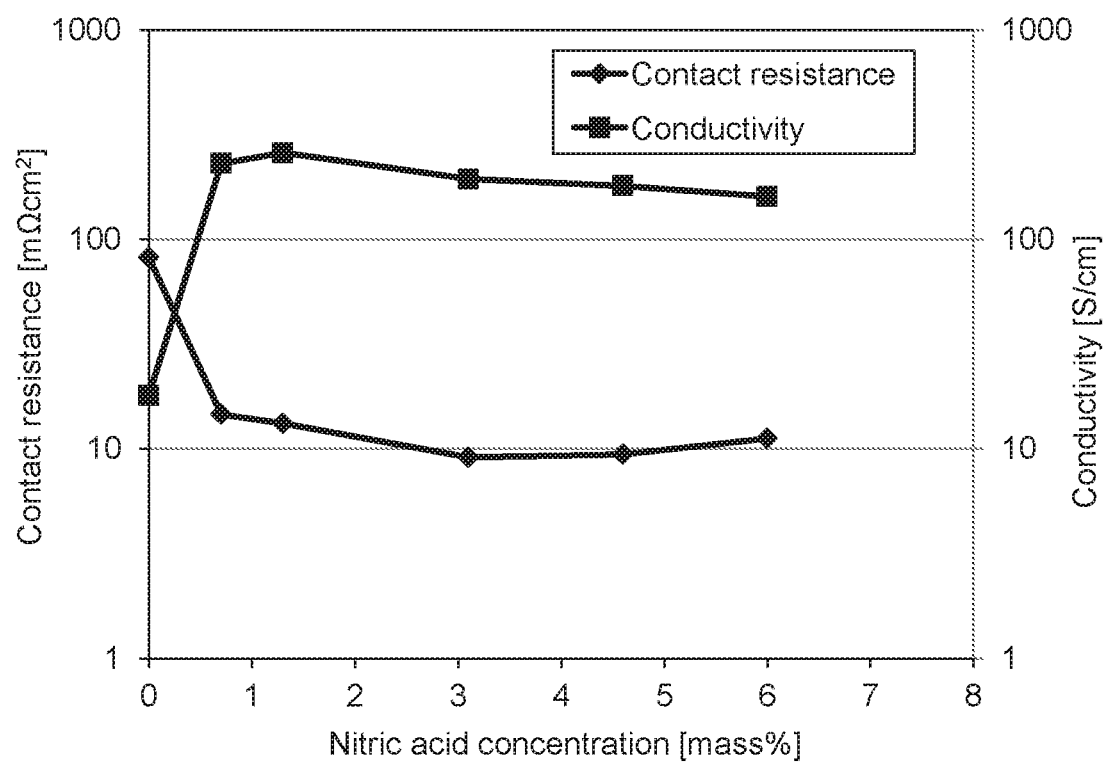
FIG. 4 is a graph indicating a contact resistance and a conductivity with respect to a mass concentration of nitric acid for test specimens of Examples 2-1 to 2-6.
Figure 5:
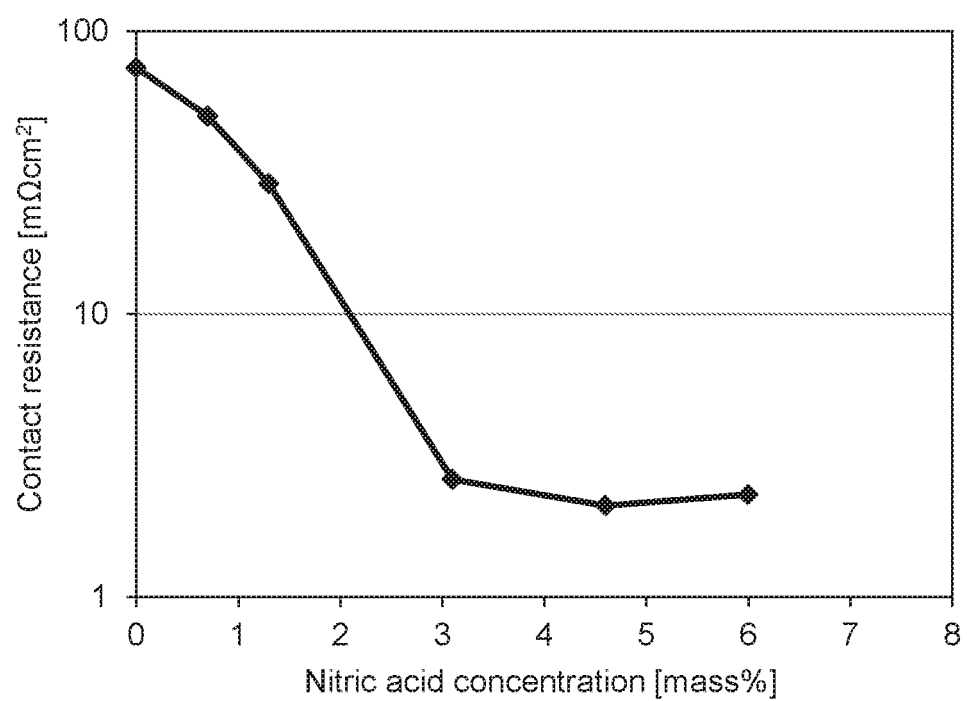
FIG. 5 is a graph indicating a contact resistance with respect to a mass concentration of nitric acid for test specimens of Reference Examples 1 to 6.

For the test specimens of Examples 2-1 to 2-6, the contact resistance ($m\Omega \cdot cm^2$) and the conductivity (S/cm) were obtained with the method similar to that in Evaluation 1. Table 2 indicates the mass concentrations of hydrochloric acid, the mass concentrations of nitric acid, the contact resistances, and the conductivities of the test specimens of Examples 2-1 to 2-6 with the contact resistances on a surface of an unprocessed metal substrate. FIG. 4 is a graph indicating the contact resistance and the conductivity with respect to the mass concentration of nitric acid of the test specimens of Examples 2-1 to 2-6. Furthermore, for the test specimens of Reference Examples 1 to 6, the contact resistances ($m\Omega \cdot cm^2$) were obtained. The contact resistances were calculated based on a value of a voltage applied between the test specimen and the gas diffusion layer which was measured while a current of IA was flown in a state where a gas diffusion layer (TGP-H-060 manufactured by Toray Industries, Inc.) was layered on the surface of the test specimen to which the mist had been supplied, and a load of 1 MPa was applied in the layered direction. Table 3 indicates the mass concentrations of hydrochloric acid, the mass concentrations of nitric acid, and the contact resistances of the test specimens of Reference Examples 1 to 6 with the contact resistances of a surface of an unprocessed metal substrate. FIG. 5 is a graph indicating the contact resistances with respect to the mass concentrations of nitric acid of the test specimens of Reference Examples 1 to 6.

TABLE 2

|  | Hydrochloric acid concentration [mass %] | Nitric acid concentration [mass %] | Contact resistance [mΩ·cm²] | Conductivity [S/cm] |
|---|---|---|---|---|
| Example 2-1 | 1.7 | — | 82 | 18 |
| Example 2-2 | 1.7 | 0.7 | 14.6 | 230 |
| Example 2-3 | 1.7 | 1.3 | 13.2 | 259 |
| Example 2-4 | 1.7 | 3.1 | 9.1 | 194 |
| Example 2-5 | 1.7 | 4.6 | 9.4 | 180 |
| Example 2-6 | 1.7 | 6.0 | 11.2 | 160 |
| Unprocessed metal substrate | — | — | 100 | — |

TABLE 3

|  | Hydrochloric acid concentration [mass %] | Nitric acid concentration [mass %] | Contact resistance [mΩ·cm²] |
|---|---|---|---|
| Reference example 1 | 1.7 | — | 74.2 |
| Reference example 2 | 1.7 | 0.7 | 50.1 |
| Reference example 3 | 1.7 | 1.3 | 28.9 |
| Reference example 4 | 1.7 | 3.1 | 2.6 |
| Reference example 5 | 1.7 | 4.6 | 2.1 |
| Reference example 6 | 1.7 | 6.0 | 2.3 |
| Unprocessed metal substrate | — | — | 100 |

In the test specimens of the fuel cell separators of Examples 2-1 to 2-6, as illustrated in Table 2 and FIG. 4, when the mass concentration of nitric acid was increased from 0 mass % to 1.3 mass %, the conductivity was significantly improved and the contact resistance was significantly decreased. When the mass concentration of nitric acid was increased from 1.3 mass % to 4.6 mass %, the conductivity tended not to be improved but to be decreased while the contact resistance tended to be continuously decreased. When the mass concentration of nitric acid was in a range of 3.1 mass % to 4.6 mass %, the contact resistance became 10 mΩ·cm² or less.

Meanwhile, for the test specimens of Reference Examples 1 to 6 without the conductive oxide film on the surface of the metal substrate, as illustrated in Table 3 and FIG. 5, when the mass concentration of nitric acid was increased from 0 mass % to 1.3 mass %, the contact resistance was decreased, and the contact resistance was decreased also when the mass concentration of nitric acid was increased from 1.3 mass % to 4.6 mass %. The decrease of the contact resistance was larger when the mass concentration of nitric acid was increased from 1.3 mass % to 3.1 mass % compared with when the mass concentration of nitric acid was increased from 0 mass % to 1.3 mass %.

From these results, first, for the test specimen of Example 2-1, the decrease in contact resistance compared with the unprocessed metal substrate is considered to be caused by the removal of the film such as the oxide film on the surface of the metal substrate due to the action of hydrochloric acid, the formation of the conductive oxide film, and the like. For the test specimens of Examples 2-1 to 2-6, the significant improvement of the conductivity in the increase of the mass concentration of nitric acid to 1.3 mass % is considered to be caused by the improvement of the crystallinity of the conductive oxide film and the like. Furthermore, the significant decrease in contact resistance at this time is considered to be caused by the more effective removal of the film on the surface of the metal substrate, the significant improvement of the conductivity of the conductive oxide film, and the like.

For the test specimens of Examples 2-1 to 2-6, the tendency of decrease in conductivity in the increase of the mass concentration of nitric acid from 1.3 mass % to 6.0 mass % is considered to be caused by the changed crystallinity of the conductive oxide film and the like. Furthermore, the tendency of decrease in contact resistance in the increase of the mass concentration of nitric acid from 1.3 mass % to 4.6 mass % is considered to be caused by, for example, the further effective removal of the film such as the oxide film on the surface of the metal substrate due to an aqua regia generated through the reaction of hydrochloric acid and nitric acid in the raw material solution, because similar results were obtained for the test specimens of Reference Examples 1 to 6.

For the test specimens of Reference Examples 1 to 6, since the conductive oxide film was not formed on the surface of the metal substrate, the contact resistance returned to the values before the supply process of the mist to the surface of the metal substrate after leaving them for one day.

While the embodiments of the method for manufacturing the fuel cell separator according to the present disclosure have been described in detail above, the present disclosure is not limited thereto, and can be subjected to various kinds of changes in design without departing from the spirit and scope of the present disclosure described in the claims.

All publications, patents and patent applications cited in the present description are herein incorporated by reference as they are.

DESCRIPTION OF SYMBOLS

2 Raw material solution
2a Mist
4 Metal substrate
6 Conductive oxide film

What is claimed is:

1. A method for manufacturing a fuel cell separator by forming a conductive oxide film on a surface of a metal substrate using a mist CVD method, the method comprising:
   preparing a raw material solution containing a precursor of the conductive oxide film and hydrochloric acid;
   atomizing the raw material solution to generate a mist; and
   supplying the mist to the surface of the metal substrate to form the conductive oxide film on the surface of the metal substrate through a reaction by heat,
   wherein the raw material solution further contains nitric acid, and
   wherein the raw material solution has a ratio of a mass concentration of nitric acid to a mass concentration of hydrochloric acid in a range of 0.4 or more and 3.6 or less;

wherein the raw material solution has the mass concentration of hydrochloric acid in a range of 1.7 mass % or more and 1.8 mass % or less: and wherein the raw material solution has the mass concentration of nitric acid in a range of 0.7 mass % or more and 6.0 mass % or less.

2. The method for manufacturing a fuel cell separator according to claim 1, wherein the raw material solution has the ratio of a mass concentration of nitric acid to mass concentration of hydrochloric acid in a range of 1.8 or more and 3.6 or less.

3. The method for manufacturing a fuel cell separator according to claim 2, wherein the raw material solution has the ratio of a mass concentration of nitric acid to mass concentration of hydrochloric acid in a range of 1.8 or more and 2.8 or less.

* * * * *